(12) United States Patent
Lee et al.

(10) Patent No.: US 8,330,490 B2
(45) Date of Patent: Dec. 11, 2012

(54) INTERLOCK CIRCUIT AND INTERLOCK SYSTEM INCLUDING THE SAME

(75) Inventors: Jung-ho Lee, Goyang (KR); Eun-Chul Kang, Seoul (KR); Won-Hi Oh, Bucheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 12/941,803

(22) Filed: Nov. 8, 2010

(65) Prior Publication Data

US 2011/0316585 A1 Dec. 29, 2011

(30) Foreign Application Priority Data

Jun. 24, 2010 (KR) .................. 10-2010-0060098

(51) Int. Cl.
*G06F 7/50* (2006.01)
*H03K 17/16* (2006.01)

(52) U.S. Cl. ............................ 326/52; 326/26

(58) Field of Classification Search ............... 326/9–14, 326/46, 104, 112, 114, 119
See application file for complete search history.

(56) References Cited

U.S. PATENT DOCUMENTS

| | | | | |
|---|---|---|---|---|
| 3,859,513 A | * | 1/1975 | Chuang et al. | 714/797 |
| 4,939,765 A | * | 7/1990 | Benjamin et al. | 379/27.06 |
| 5,559,453 A | * | 9/1996 | Covino et al. | 326/93 |
| 6,118,297 A | * | 9/2000 | Schenck | 326/35 |
| 6,909,307 B2 | * | 6/2005 | Mitarashi | 326/56 |
| 7,003,683 B2 | * | 2/2006 | Muroor | 713/500 |

* cited by examiner

*Primary Examiner* — Thienvu Tran
(74) *Attorney, Agent, or Firm* — Okamoto & Benedicto LLP

(57) ABSTRACT

An interlock circuit includes an input delay unit and an output suppressing unit. The input delay unit delays a plurality of input signals, provides a plurality of delayed input signals, and provides a plurality of exclusive input signals by performing a logical operation on the plurality of delayed input signals. The output suppressing unit provides a plurality of output signals, which are not simultaneously enabled, based on the plurality of exclusive input signals and the plurality of input signals.

14 Claims, 10 Drawing Sheets

INTERLOCK CIRCUIT AND INTERLOCK SYSTEM INCLUDING THE SAME

CROSS-REFERENCE TO RELATED PATENT APPLICATION

This application claims the benefit of Korean Patent Application No. 10-2010-0060098, filed on Jun. 24, 2010, in the Korean Intellectual Property Office, the disclosure of which is incorporated herein in its entirety by reference.

BACKGROUND OF THE INVENTION

1. Field of the Invention

The present invention relates to an interlock circuit, and more particularly, to an interlock circuit for performing a first-in first-out (FIFO) operation and an interlock system including the interlock circuit.

2. Description of the Related Art

An interlock circuit refers to a circuit that, when one of a plurality of circuits operates, the others of the plurality of circuits prevent to operate even though input signals are applied to the other circuits. That is, an interlock circuit refers to a circuit for preventing an operation of a circuit until certain conditions are satisfied.

SUMMARY OF THE INVENTION

The present invention provides an interlock circuit that performs a first-in first-out function, and, if inputs to and outputs from a plurality of circuits occur at substantially the same time, offsets the inputs and the outputs to suppress the simultaneous input signals, and an interlock system including the interlock circuit.

The present invention also provides an interlock circuit that provides an output signal irrespective of a temporary peak signal, and reduces output signal error by inserting a predetermined dead time after one output signal is disabled, and an interlock system including the interlock circuit.

In some example embodiments, there is provided an interlock circuit including an input delay unit and an output suppressing unit. The input delay unit delays a plurality of input signals, provides a plurality of delayed input signals, and provides a plurality of exclusive input signals by performing a logical operation on the plurality of delayed input signals. The output suppressing unit provides a plurality of output signals, which are not simultaneously enabled, based on the plurality of exclusive input signals and the plurality of input signals.

The input delay unit may include: a delay unit comprising a plurality of input delay circuits that respectively delay the plurality of input signals and provide the plurality of delayed input signals; and an exclusive logical operation unit comprising a plurality of exclusive logical operation circuits that provide the plurality of exclusive input signals by respectively performing exclusive logical operations on the plurality of delayed input signals.

A first exclusive logical operation circuit included in the plurality of exclusive logical operation circuits may provide a first exclusive input signal included in the plurality of exclusive input signals by performing a logical AND operation on a first delayed input signal included in the plurality of delayed input signals, and complementary signals of delayed input signals other than the first delayed input signal.

The plurality of input delay circuits may include a first input delay circuit, and the first input delay circuit may include first and second transistors, first and second resistors, and a capacitor. The first transistor may include a gate that receives a first input signal included in the plurality of input signals and a first terminal that receives a power supply voltage. The first resistor may be connected between a first node and a second terminal of the first transistor. The second transistor may include a gate that receives the first input signal, a first terminal that is connected to a ground voltage, and a second terminal that is connected to the first node. The second resistor may be connected between the first node and a second node. The capacitor may be connected between the ground voltage and the second node. For example, the plurality of delayed input signals may include a first delayed input signal, and the first delayed input signal may be provided by the second node. The first delayed input signal may be delayed by a predetermined input delay time when the first input signal transitions from logic state "low" to logic state "high", and the first delayed input signal may be delayed by a predetermined dead time when the first input signal transitions from logic state "high" to logic state "low". A predetermined delay time may include the predetermined input delay time and the predetermined invalid time.

The predetermined input delay time and the predetermined dead time may be determined based on the first and second resistors. For example, the predetermined dead time may be longer than the predetermined input delay time.

The output suppressing unit may include a plurality of output suppressing circuits each including a set circuit, a reset circuit, and an output latch circuit. The set circuit may provide a first set signal by performing a logical AND operation based on a first exclusive input signal included in the plurality of exclusive input signals, a first delayed input signal included in the plurality of delayed input signals, and a second complementary input signal corresponding to a complementary signal of a second input signal included in the plurality of input signals. The reset circuit may provide a first reset signal by performing an OR logical operation on a second output signal and a first complementary input signal corresponding to a complementary signal of the first input signal. The output latch circuit may provide a first output signal based on the first set signal and the first reset signal.

The output latch circuit may enable the first output signal in response to the first set signal, and disable the first output signal in response to the first reset signal.

In some example embodiments, there is provided an interlock circuit including: a delay unit that receives a first input signal and a second input signal, delays the first input signal and the second input signal by a predetermined delay time, and provides first and second delayed input signals; an exclusive logical operation unit that provides first and second exclusive input signals by performing an exclusive logical operation on the first and second delayed input signals; a noise removing unit that provides first and second noise suppressed signals based on first and second reset signals, and the first and second delayed input signals; a set unit that provides a first set signal based on the first noise suppressed signal, the first exclusive input signal, and the second input signal, and a second set signal based on the second noise suppressed signal, the second exclusive input signal, and the first input signal; a reset unit that provides a first reset signal based on the first input signal and a second output signal, and a second reset signal based on the second input signal and a first output signal; and an output latch unit that provides the first output signal based on the first set signal and the first reset signal, and the second output signal based on the second set signal and the second reset signal.

The noise removing unit may include: a first noise removing latch circuit that enables the first noise suppressed signal in response to the first delayed input signal, and disables the first noise suppressed signal in response to the first reset signal; and a second noise removing latch circuit that enables the second noise suppressed signal in response to the second delayed input signal, and disables the second noise suppressed signal in response to the second reset signal.

The set unit may include a first set circuit and a second set circuit.

The first set circuit may provide the first set signal by performing a logical AND operation on the first noise suppressed signal, the first exclusive input signal, and a second complementary input signal corresponding to a complementary signal of the second input signal, and a second set circuit may provide the second set signal by performing a logical AND operation on the second noise suppressed signal, the second exclusive input signal, and a first complementary input signal corresponding to a complementary signal of the first input signal.

The reset unit may include a first reset circuit and a second reset circuit. The first reset circuit may provide the first reset signal by performing an OR logical operation on the second output signal and a first complementary input signal corresponding to a complementary signal of the first input signal, and the second reset circuit may provide the second reset signal by performing an OR logical operation on the first output signal and a second complementary input signal corresponding to a complementary signal of the second input signal.

The output latch unit may include a first output latch circuit and a second output latch circuit, and each of the first and second output latch circuits may be a reset/set latch circuit that receives the first and second set signals as a set signal and the first and second reset signals as a reset signal. Accordingly, the first output latch circuit may enable the first output signal in response to the first set signal and disable the first output signal in response to the first reset signal, and the second output latch circuit may enable the second output signal in response to the second set signal and disable the second output signal in response to the second reset signal.

The first output latch circuit may maintain a previous state of the first output signal when both the first set signal and the first reset signal are disabled, and the second output latch circuit may maintain a previous state of the second output signal when both the second set signal and the second reset signal are disabled.

In some example embodiments, there is provided an interlock system including an interlock circuit and an output terminal. The interlock circuit receives first and second input signals and provides first and second output signals that are not enabled simultaneously. The output terminal provides a system output signal in response to the first and second output signals. The interlock circuit includes an input delay unit and an output suppressing unit. The input delay unit delays the first and second input signals by a predetermined delay time, provides first and second delayed input signals, and provides first and second exclusive input signals by performing a logical operation on the first and second delayed input signals. The output suppressing unit enables the first and second output signals based on the first and second exclusive input signals, the first and second input signals, and the first and second delayed input signals, and disables the first and second output signals based on the first and second input signals and the first and second output signals.

The output terminal may include: a first output transistor comprising a gate that receives the first output signal, and a first terminal that receives a high power supply voltage; and a second output transistor comprising a gate that receives the second output signal, a first terminal that is connected to a second terminal of the first output transistor, and a second terminal that is connected to a ground voltage. The system output signal may be provided through the second terminal of the first output transistor, that is, the first terminal of the second transistor.

The output terminal may include an RS latch and a power output unit. The RS latch may enable a power input signal in response to the first output signal, and disables the power input signal in response to the second output signal. The power output unit may provide the system output signal in response to the power input signal. For example, the power output unit may include: a first output transistor comprising a gate that receives the power input signal, and a first terminal that is connected to a first high power supply voltage; and a second output transistor comprising a gate that receives the power output signal, a first terminal that is connected to a second terminal of the first output transistor, and a second terminal that is connected to a second high power supply voltage. The system output signal may be provided from the second terminal of the first output transistor.

The interlock system may further include: a first input signal generating unit that comprises a third resistor connected in series between the first high power supply voltage and a ground voltage, and a third transistor, and provides the first input signal to a terminal between the third resistor and the third output transistor in response to a first pulse signal; and a fourth input signal generating unit that comprises a fourth resistor connected in series between the first high power supply voltage and the ground voltage, and a fourth output transistor, and provides the second input signal to a terminal between the fourth resistor and the fourth output transistor in response to a second pulse signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE INVENTION

Figure 1:
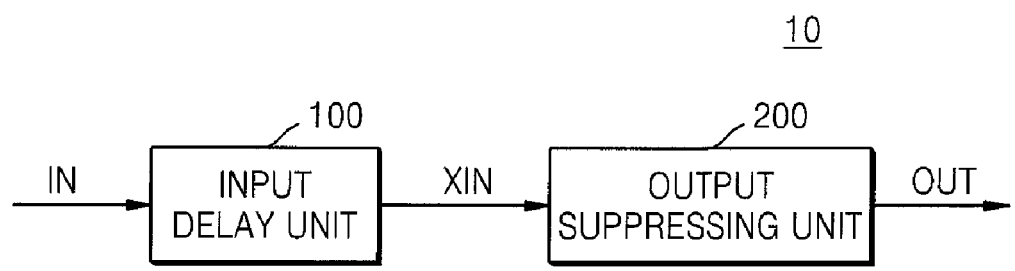
FIG. 1 is a block diagram illustrating an interlock circuit according to some example embodiments.

Detailed illustrative example embodiments are disclosed herein. However, specific structural and functional details disclosed herein are merely representative for purposes of describing example embodiments. This invention, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention will now be described more fully with reference to the accompanying drawings, in which exemplary embodiments of the invention are shown. In the drawings, the same elements are denoted by the same reference numerals, and a repeated explanation thereof will not be given.

FIG. 1 is a block diagram illustrating an interlock circuit 10 according to some example embodiments.

Referring to FIG. 1, the interlock circuit 10 may include an input delay unit 100 and an output suppressing unit 200.

The input delay unit 100 receives an input signal IN including a plurality of input signals, delays the input signal IN, and provides an exclusive input signal XIN including a plurality of exclusive input signals by performing a logical operation on the delayed input signals. The delayed input signals may correspond to a plurality of delayed input signals. For example, when first and second exclusive input signals are provided by performing a logical operation on first and second delayed input signals included in the plurality of delayed input signals, the first exclusive input signal may be provided by performing a logical AND operation on the first delayed input signal and a complementary signal of the second delayed input signal, and the second exclusive input signal may be provided by performing a logical AND operation on the second delayed input signal and a complementary signal of the first delayed input signal.

The output suppressing unit 200 provides an output signal OUT including a plurality of output signals based on the exclusive input signal XIN, the input signal IN, and a delayed input signal DIN including the plurality of delayed input signals. In the interlock circuit 10, only one output signal from among the plurality of output signals at the same point of time may be enabled and may correspond to logic state "high". That is, in order to prevent a plurality of output signals from being simultaneously enabled, the interlock circuit 10 may suppress the plurality of output signals from being simultaneously enabled by performing a logical operation on the exclusive input signal XIN, the input signal IN, and the delayed input signal DIN.

For example, one output signal to be enabled may be selected from among a plurality of output signals in a first-in first-out (FIFO) manner. Accordingly, if there is an output signal that is first enabled, even though conditions where other output signals are to be enabled are provided, the other output signals are maintained in disabled states until the output signal that is first enabled is disabled. An operation of suppressing the output signal OUT will be described below.

Figure 2:
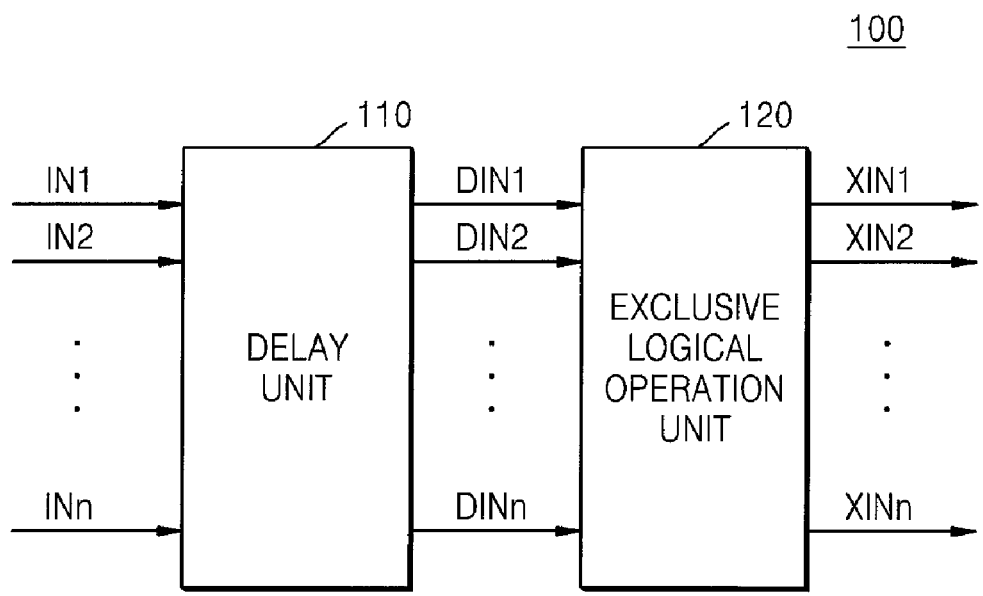
FIG. 2 is a block diagram illustrating an input delay unit of the interlock circuit of FIG. 1.

FIG. 2 is a block diagram illustrating the input delay unit 100 of the interlock circuit 10 of FIG. 1, according to some example embodiments.

Referring to FIG. 2, the input delay unit 100 may include a delay unit 110 including a plurality of input delay circuits, and an exclusive logical operation unit 120 including a plurality of exclusive logical operation circuits.

The delay unit 110 receives a plurality of input signals, that may be referred as first to nth input signals IN1, IN2, . . . , and INn, delays the plurality of input signals IN1, IN2, . . . , and INn by a predetermined time, and provides a plurality of delayed input signals, that may be referred as first to nth delayed input signals DIN1, DIN2, . . . , and DINn. For example, a first input delay circuit included in the plurality of input delay circuits may receive the first input signal IN1, delay the first input signal IN1 by the predetermined time, and provide the first delayed input signal DIN1.

For example, a predetermined delay time by which the plurality of delayed input signals DIN1, DIN2, . . . , and DINn are obtained by delaying the plurality of input signals IN1, IN2, . . . , and INn may vary according to transition states of the plurality of input signals IN1, IN2, . . . , and INn. For example, on a rising edge where the first input signal IN1 transitions from logic state "low" to logic state "high", the first delayed input signal DIN1 may correspond to a signal obtained by delaying the first input signal IN1 by a predetermined input delay time. On the contrary, on a falling edge where the first input signal IN1 transitions from logic state "high" to logic state "low", the first delayed input signal DIN1 may correspond to a signal obtained by delaying the first input signal IN1 by a predetermined dead time. The predetermined input delay time and the predetermined dead time may be different from each other. For example, the predetermined input delay time may be shorter than the predetermined dead time. The predetermined input delay time and the predetermined dead time may vary according to a configuration of each of the input delay circuits.

The exclusive logical operation unit 120 receives the plurality of delayed input signals DIN1, DIN2, . . . , and DINn, and provides a plurality of exclusive input signals, that may be referred as first to nth exclusive input signals XIN1, XIN2, . . . , and XINn by respectively performing exclusive logical operations. The plurality of delayed input signals DIN1, DIN2, and DINn may be applied to corresponding exclusive logical operation circuits to provide a plurality of corresponding exclusive input signals XIN1, XIN2, . . . , and XINn. For example, the first exclusive logical operation circuit included in the plurality of exclusive logical operation circuits receives the first delayed input signal DIN1, and performs an exclusive logical operation on the delayed input signals DIN2, . . . , and DINn other than the first delayed input signal DIN1. Herein, an exclusive logical operation refers to a logical AND operation performed on a corresponding delayed input signal and complementary signals of delayed input signals other than the corresponding delayed input signal. The first exclusive input signal XIN1 is provided by performing a logical AND operation on the first delayed input signal DIN1, and complementary signals of other delayed input signals DIN2, . . . , and DINn. Accordingly, when the first delayed input signal DIN1 is enabled and the other delayed input signals DIN2, . . . , and DINn are disabled, the first exclusive input signal XIN1 is enabled.

Figure 3:
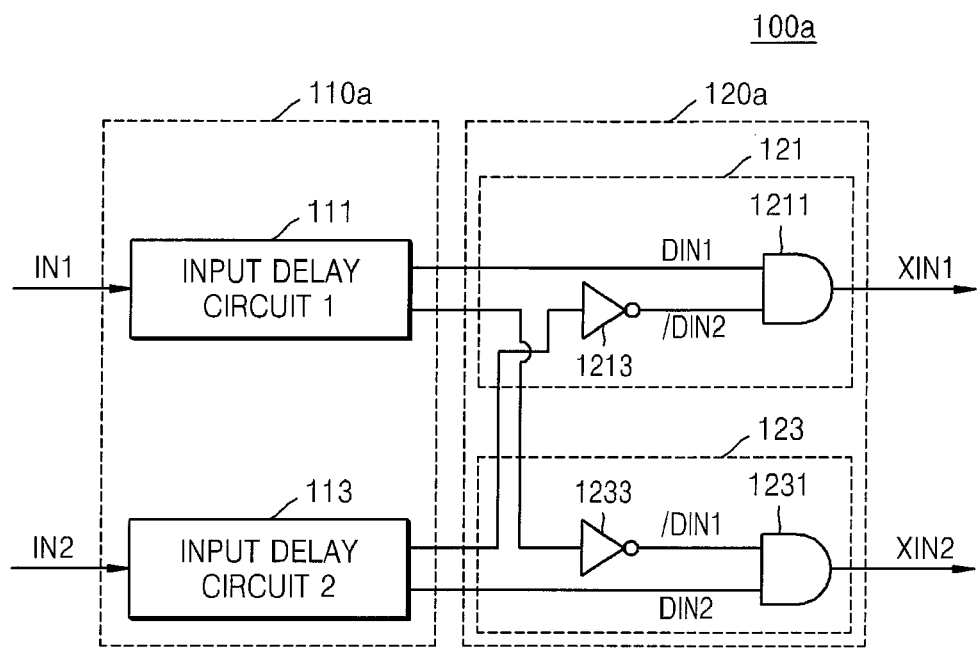
FIG. 3 is a diagram illustrating an input delay unit according to some example embodiments.

FIG. 3 is a diagram illustrating an input delay unit 100*a* according to some example embodiments.

Referring to FIG. 3, the input delay unit 100*a* may include a delay unit 110*a* and an exclusive logical operation unit 120*a*. The delay unit 110*a* and the exclusive logical operation unit 120*a* respectively are examples of the delay unit 110 and the exclusive logical operation 120 illustrated in FIG. 2.

The delay unit 110*a* may include a first input delay circuit 111 and a second input delay circuit 113, and the exclusive logical operation unit 120*a* may include a first exclusive logical operation circuit 121 and a second exclusive logical operation circuit 123.

The first input delay circuit 111 receives the first input signal IN1, delays the first input signal IN1 by a predetermined delay time, and provides the first delayed input signal DIN1. The second input delay circuit 113 receives the second input signal IN2, delays the second input signal IN2 by the predetermined delay time, and provides the second delayed input signal DIN2. For example, the predetermined delay time may include a predetermined input delay time and a predetermined dead time. Accordingly, on a rising edge where the first and second input signals IN1 and IN2 transition from logic state "low" to logic state "high", the first and second delayed input signals DIN1 and DIN2 may be signals obtained by delaying the first and second input signals IN1 and IN2 by the predetermined input delay time, and on a falling edge where the first and second input signals IN1 and IN2 transition from logic state "high" to logic state "low", the first and second delayed input signals DIN1 and DIN2 may be signals obtained by delaying the first and second input signals IN1 and IN2 by the predetermined dead time.

The first exclusive logical operation circuit 121 may include a first AND gate 1211 and a first inverter 1213. The first inverter 1213 inverts the second delayed input signal DIN2, and provides a second complementary delayed input signal /DIN2 corresponding to a complementary signal of the second delayed input signal DIN2 to the first AND gate 1211. The first AND gate 1211 provides the first exclusive input signal XIN1 by performing a logical AND operation on the first delayed input signal DIN1 and the second complementary delayed input signal /DIN2.

The second exclusive logical operation circuit 123 may include a second AND gate 1231 and a second inverter 1233. The second inverter 1233 inverts the first delayed input signal DIN1, and provides a first complementary delayed input signal /DIN1 corresponding to a complementary signal of the first delayed input signal DIN1 to the second AND gate 1231. The second AND gate 1231 provides the second exclusive input signal XIN2 by performing a logical AND operation on the second delayed input signal DIN2 and the first complementary delayed input signal /DIN1.

As described with reference to FIG. 2, on a falling edge of the first and second input signals IN1 and IN2, the first and second delayed input signals DIN1 and DIN2 may be delayed by the predetermined dead time and then provided. According to the predetermined dead time determined in the first and second input delay circuits 111 and 113, the first and second exclusive input signals XIN1 and XIN2 transition in response to a falling edge of the first and second delayed input signals DIN1 and DIN2. The predetermined dead time may vary according to a configuration of each input delay circuit.

Figure 4:
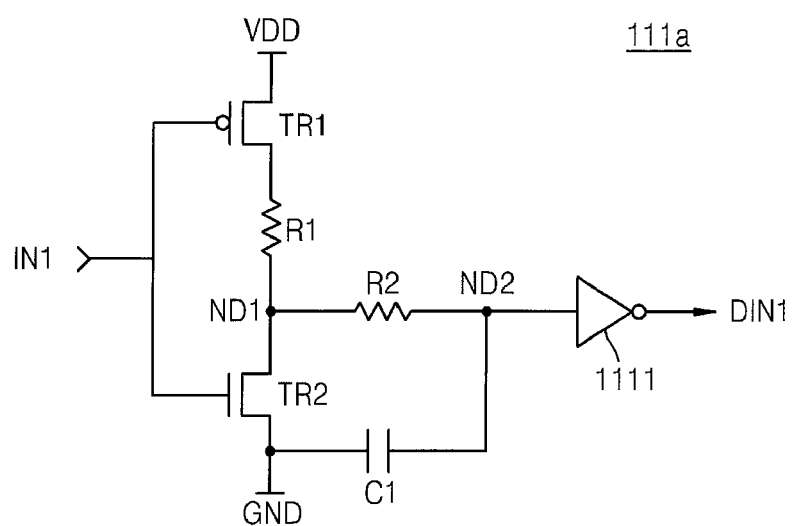
FIG. 4 is a circuit diagram illustrating an input delay circuit according to some example embodiments.

FIG. 4 is a circuit diagram illustrating of an input delay circuit 111*a* according to some example embodiments.

The input delay circuit 111*a* is an example of the first input delay circuit 111 of FIG. 3. In the interlock circuit 10, each of the plurality of input delay circuits may have substantially the same configuration as that illustrated in FIG. 4.

Referring to FIG. 4, the input delay circuit 111*a* may include a first transistor TR1, a second transistor TR2, a first resistor R1, a second resistor R2, and a capacitor C1.

The first transistor TR1 may include a gate that receives the first input signal IN1, a first terminal that receives a voltage of a power supply voltage VDD, and a second terminal that is connected to the first resistor R1. For example, the first transistor TR1 may be a P-type metal-oxide semiconductor (PMOS) transistor, the first terminal may be a source terminal, and the second terminal may be a drain terminal.

The second transistor TR2 may include a gate that receives the first input signal IN1, a first terminal that is connected to a ground voltage GND, and a second terminal connected to a first node ND1. For example, the second transistor TR2 may be an N-type MOS (NMOS) transistor, the first terminal may be a source terminal, and the second terminal may be a drain terminal.

The first resistor R1 may be connected to the first node ND1 and the second terminal of the first transistor TR1, and the second resistor R2 may be connected between the first node ND1 and a second node ND2.

The capacitor C1 may be connected to the second node ND2 and the first terminal of the second transistor TR2.

The first transistor TR1 and the second transistor TR2 may be complementarily turned on or off according to the first input signal IN1. Although it is desirable that a signal that is substantially the same as the first input signal IN1 is provided to the second node ND2, the first input signal IN1 may be delayed by a predetermined delay time based on the first resistor R1 and the second resistor R2 and the delayed input signal is provided to the second node ND2.

For example, when the first input signal IN1 corresponds to logic state "high", the second transistor TR2 is turned on and the first transistor TR1 is turned off, and thus a voltage of the second node ND2 may correspond to a voltage of the ground voltage GND. Also, when the first input signal IN1 corresponds to logic state "low", the second transistor TR2 is turned off and the first transistor TR1 is turned on, and thus a voltage of the second node ND2 may correspond to a voltage of the power supply voltage VDD. However, a signal corresponding to a voltage provided to the second node ND2 may be changed when the first input signal IN1 is delayed by the predetermined delay time. For example, a third inverter 1111 may be electrically connected to the second node ND2. As described above, when the first transistor TR1 is a PMOS transistor and the second transistor TR2 is an NMOS transistor, since an output signal corresponding to a voltage of the second node ND2 may correspond to a complementary signal of the first input signal IN1, the second inverter 1111 may invert the voltage of the second node ND2 and provide the first delayed input signal DIN1.

The predetermined input delay time and the predetermined dead time of the input delay circuit 111a may be calculated as shown in Equation 1.

$$\frac{R_2}{R_1 + R_2} = \frac{t_{input\ filter\ time}}{t_{dead\ time}} \quad \text{[Equation 1]}$$

where $t_{dead\ time}$ is the predetermined dead time, and $t_{input\ filter\ time}$ is the predetermined input delay time.

The predetermined input delay time may be referred to as a predetermined input filter time. The predetermined input delay time and the predetermined dead time may be determined based on the first resistor R1 and the second resistor R2. For example, since predetermined input delay times and predetermined dead times set for the plurality of input delay circuits may be substantially the same, configurations of the input delay circuits may be substantially the same.

For example, the first resistor R1 may have a value greater than that of the second resistor R2. Also, the predetermined dead time may be different from the predetermined input delay time, and the input delay circuit 111a of FIG. 4 may be an asymmetric input delay circuit.

Figure 5:
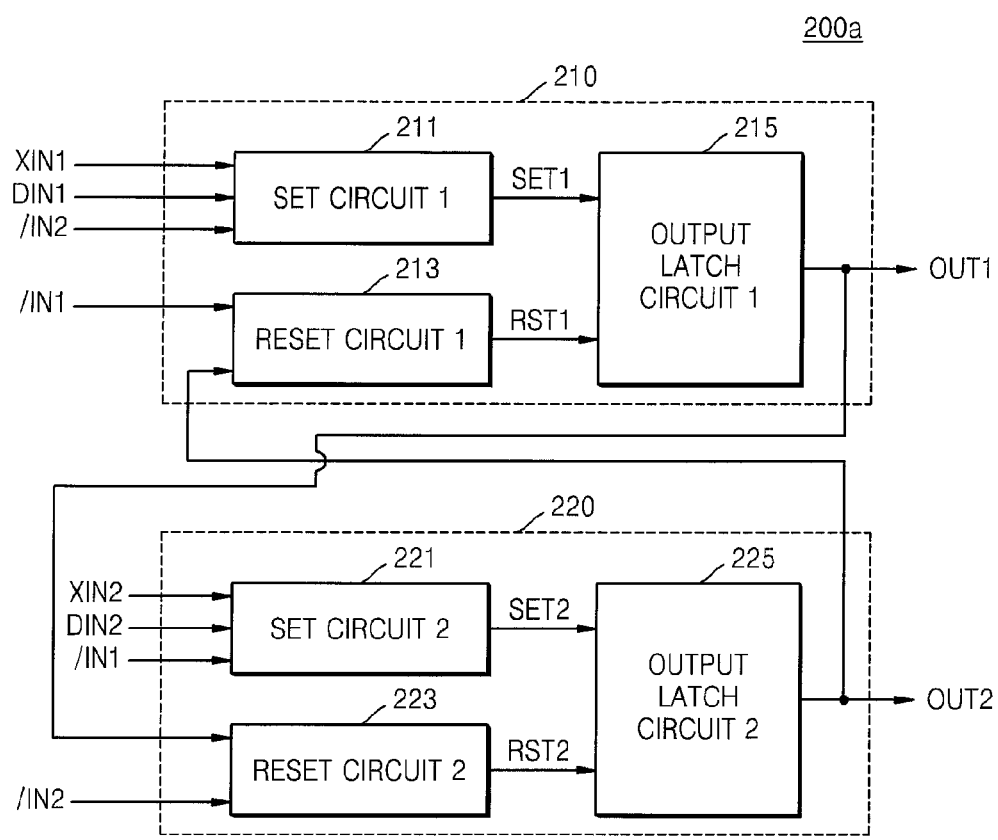
FIG. 5 is a block diagram illustrating an output suppressing unit according to some example embodiments.

FIG. 5 is a block diagram illustrating an output suppressing unit 200a according to some example embodiments.

The output suppressing unit 200a of FIG. 5 is an example of the output suppressing unit 200 of the interlock circuit 10 of FIG. 1, but the example embodiments are not limited thereto. That is, although the output suppressing unit 200a includes a first suppressed output circuit 210 and a second output suppressing circuit 220 in FIG. 5, the present embodiment is not limited thereto, and the output suppressing unit 200 may include a plurality of output suppressing circuits.

The first output suppressing circuit 210 may include a first set circuit 211, a first reset circuit 213, and a first output latch circuit 215.

The first set circuit 211 provides a first set signal SET1 by performing a logical AND operation on the first exclusive input signal XIN1, the first delayed input signal DIN1, and the second complementary input signal /IN2.

The first reset circuit 213 provides a first reset signal RST1 by performing a logical OR operation on the first complementary input signal /IN1 and the second output signal OUT2.

The first output latch circuit 215 may enable the first output signal OUT1 in response to the first set signal SET1, and disable the first output signal OUT1 in response to the first reset signal RST1. For example, the first output latch circuit 215 may be a reset/set (RS) latch circuit. The RS latch circuit includes two NOR gates, and each of the NOR gate receives the first set signal SET1 and the first reset signal RST1. Also, an output signal of one NOR gate may be provided as an input signal of the other NOR gate.

The second output suppressing circuit 220 may include a second set circuit 221, a second reset circuit 223, and a second output latch circuit 225.

The second set circuit 221 provides a second set signal SET2 by performing a logical OR operation on the second exclusive input signal XIN2, the second delayed input signal DIN2, and the first complementary input signal /IN1.

The second reset circuit 223 provides a second reset signal RST2 by performing a logical OR operation on the first output signal OUT1 and the second complementary input signal /IN2.

The second output latch circuit 225 enables the second output signal OUT2 in response to the second set signal SET2, and disables the second output signal OUT2 in response to the second reset signal RST2.

Figure 6:
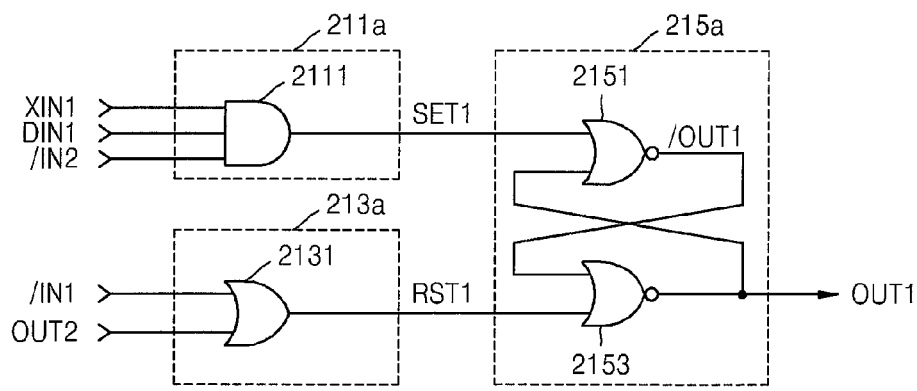
FIG. 6 is a diagram illustrating a first output suppressing circuit according to some example embodiments.

FIG. 6 is a diagram illustrating a first output suppressing circuit 210a according to an embodiment of the present invention. The first output suppressing circuit 210a of FIG. 6 is an example of the first output suppressing circuit 210 of FIG. 5, but the present embodiment is not limited thereto.

Referring to FIG. 6, the first output suppressing circuit 210a may include a first set circuit 211a, a first reset circuit 213a, and a first output latch circuit 215a.

The first set circuit 211a may include a third AND gate 2111 that provides the first set signal SET1 based on the first exclusive input signal XIN1, the first delayed input signal DIN1, and the second complementary input signal /IN2. If all of the first exclusive input signal XIN1, the first delayed input signal DIN1, and the second complementary input signal /IN2 correspond to logic state "high", the first set signal SET1 is enabled and corresponds to logic state "high". That is, if the first delayed input signal DIN1 obtained by delaying the first input signal IN1 by the predetermined input delay time is enabled and the second input signal IN2 is not yet enabled in a state where the second delayed input signal DIN2 is disabled, the first set circuit 211a enables the first set signal SET1 to enable the first output signal OUT1. Also, since the first set signal SET1 is provided based on the first exclusive input signal XIN1 in response to a falling edge of the second delayed input signal DIN2 that is obtained by delaying the first input signal IN1 by the predetermined dead time, the first output signal OUT1 is enabled after the predetermined dead time elapses, thereby minimizing interference between output signals.

The first reset circuit 213a may include a first OR gate 2131 that provides the first reset signal RST1 based on the first complementary input signal /IN1 and the second output signal OUT2. If any one of the first complementary input signal /IN1 and the second output signal OUT2 corresponds to logic state "high", the first reset signal RST1 is enabled and corresponds to logic state "high". That is, if the second output signal OUT2 is enabled, the first reset circuit 213a initializes the first output latch circuit 215a and disables the first output signal OUT1 to prevent the first and second output signals OUT1 and OUT2 from being simultaneously enabled. If the first input signal IN1 is disabled, the first reset circuit 213a may disable the first output signal OUT1.

The first output latch circuit 215a may include first and second NOR gates 2151 and 2153. The first NOR gate 2151 provides a first complementary output signal /OUT1 corresponding to a complementary signal of the first output signal OUT1 by performing a logical NOR operation on the first set signal SET1 and the first output signal OUT1. The second NOR gate 2153 outputs the first output signal OUT1 by performing a logical NOR operation on the first reset signal RST1 and the first complementary output signal /OUT1. The first output latch circuit 215a may include an RS latch circuit.

If the first set signal SET1 is enabled and corresponds to logic state "high", the first output signal OUT1 is enabled. If the first set signal SET1 is enabled and corresponds to logic state "high", the first output signal OUT1 is initialized and disabled. In an RS latch circuit, R denotes reset and S denotes set. If a reset signal is enabled, an output signal is initialized and disabled, and if a set signal is enabled, an output signal is set and enabled. In general, a reset signal and a set signal may have a complementary relationship. However, when both a reset signal and a set signal are disabled, an output signal is maintained in a previous state. Also, both a reset signal and a set signal may be prevented from being enabled or all output signals may be disabled according to types of logic elements included in the RS latch circuit.

FIGS. 7 through 10 are timing diagrams for explaining operations of the interlock circuit 10 described with reference to FIGS. 1 through 6. FIGS. 7 through 10 illustrates voltage levels of the first input signal IN1, the second input signal IN2, the first delayed input signal DIN1, the second delayed input signal DIN2, the first exclusive input signal XIN1, the second exclusive input signal XIN2, the first set signal SET1, the second set signal SET2, the first output signal OUT1, the second output signal OUT2, the first reset signal RST1, and the second reset signal RST2. A voltage level of each of the signals may correspond to logic state "high" or logic state "low". For example, if a specific signal is enabled, the specific signal may correspond to logic state "high". However, the present embodiment is not limited thereto, and the specific signal may correspond to logic state "low". The following explanation will be made on the assumption that if a specific signal is enabled, the specific signal corresponds to logic state "high".

Figure 7:
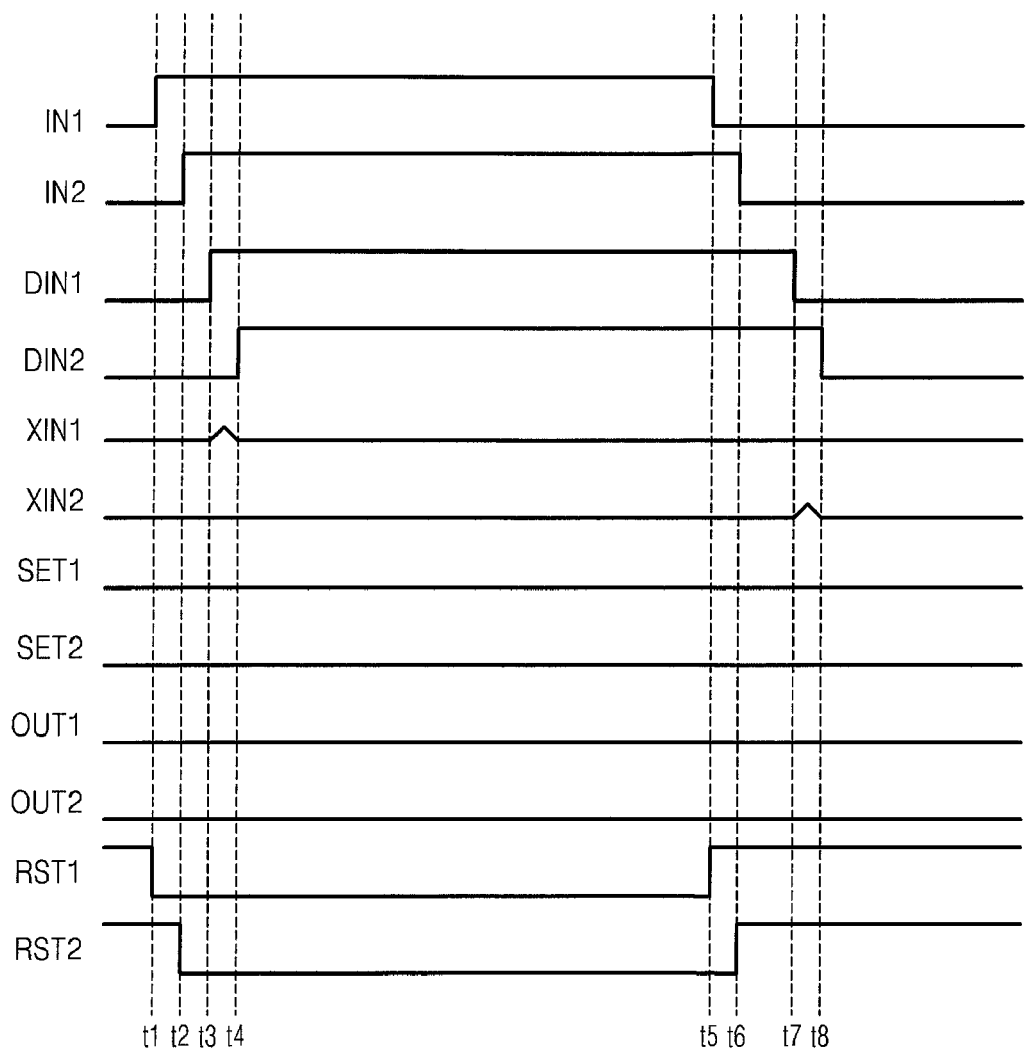
FIGS. 7 through 10 are timing diagrams for explaining operations of the interlock circuit of FIGS. 1 through 6.

FIG. 7 is a timing diagram for explaining an operation of the interlock circuit 10 when a plurality of input signals is enabled within a predetermined input delay time.

Referring to FIG. 7, at a time t1, the first input signal IN1 is enabled and the first reset signal RST1 is disabled.

At a time t2, the second input signal IN2 is enabled and the second reset signal RST2 is disabled. Since the second input signal IN2 is enabled at the time t2 before a predetermined input delay time elapses from the time t1, the second input signal IN2 precedes a time when the first delayed input signal DIN1 is enabled. Accordingly, it is difficult to determine which time is earlier or later between times when the first input signal IN1 is enabled and the second input signal IN2 is enabled. The second input signal IN2 is disabled at a time t6 within the predetermined input delay time from a time t5 at which the first input signal IN1 is disabled. The first input signal IN1 and the second input signal IN2 are enabled and disabled within the predetermined input delay time, and thus may be signals having substantially the same phase. If a plurality of input signals have substantially the same phase as described above, the plurality of input signals are referred to as in-phase signals. Since a plurality of output signals may not be enabled simultaneously because of the characteristics of the interlock circuit 10, all of such in-phase signals should be ignored. The interlock circuit of FIG. 7 may cancel in-phase signals without using an additional element.

At a time t3, the first input signal IN1 is delayed by the predetermined input delay time due to the input delay circuit 111, and the first delayed input signal DIN1 is enabled. The predetermined input delay time in FIG. 7 may correspond to a time (t3-t1) obtained by subtracting the time t1 from the time t3.

The first delayed input signal DIN1 obtained by delaying the first input signal IN1 by the predetermined input delay time is enabled at the time t3, and the first exclusive logical operation circuit 121 provides the first exclusive input signal XIN1 by performing a logical AND operation on the first delayed input signal DIN1 and the second delayed input signal DIN2 that is obtained by delaying the second input signal IN2 by the predetermined input delay time. Although it is desirable that the first exclusive input signal XIN1 is enabled in a period from the time t3 to a time t4, the first exclusive input signal XIN1 does not reach a voltage level corresponding to logic state "high" during the period from the time t3 to the time t4, thereby failing to be enabled and being maintained in a disabled state. Since the first exclusive input signal XIN1 is maintained in a disabled state, the first set signal SET1 is disabled and the first output signal OUT1 is not enabled.

The first input signal in1 is disabled at the time t5, and the second input signal IN2 is disabled at the time t6 within the predetermined input delay time from the time t5.

The first delay input signal DIN1 is disabled at a time t7 after a predetermined dead time from the time t5 at which the first input signal IN1 is disabled elapses, and the second delayed input signal DIN2 is disabled at a time t8 after the predetermined dead time from the time t6 at which the second input signal IN2 is disabled elapses. The second exclusive logical operation circuit 123 provides the second exclusive input signal XIN2 by performing a logical AND operation on the second delayed input signal DIN2 and a complementary signal of the first delayed input signal DIN1. Like the first exclusive input signal XIN1, the second exclusive input signal XIN2 does not reach logic state "high" during a period from the time t7 to the time t8, thereby being maintained in a disabled state. Accordingly, the second set signal SET2 is disabled and the second output signal OUT 2 is disabled.

In conclusion, when the first and second input signals IN1 and IN2 are enabled or disabled within the predetermined input delay time, even though the first and second input signals IN1 and IN2 are enabled, the first and second output signals OUT1 and OUT2 are not enabled and are maintained in a disabled state. The interlock circuit 10 may operate in substantially the same manner as that described above for a plurality of input signals. In an interlock circuit for performing a FIFO operation so that an output signal is enabled in response to a first enabled input signal, since it is difficult to determine which input signal is earlier or later between a plurality of input signals that are enabled within a predetermined input delay time, the plurality of input signals are ignored and output signals are disabled.

Figure 8:
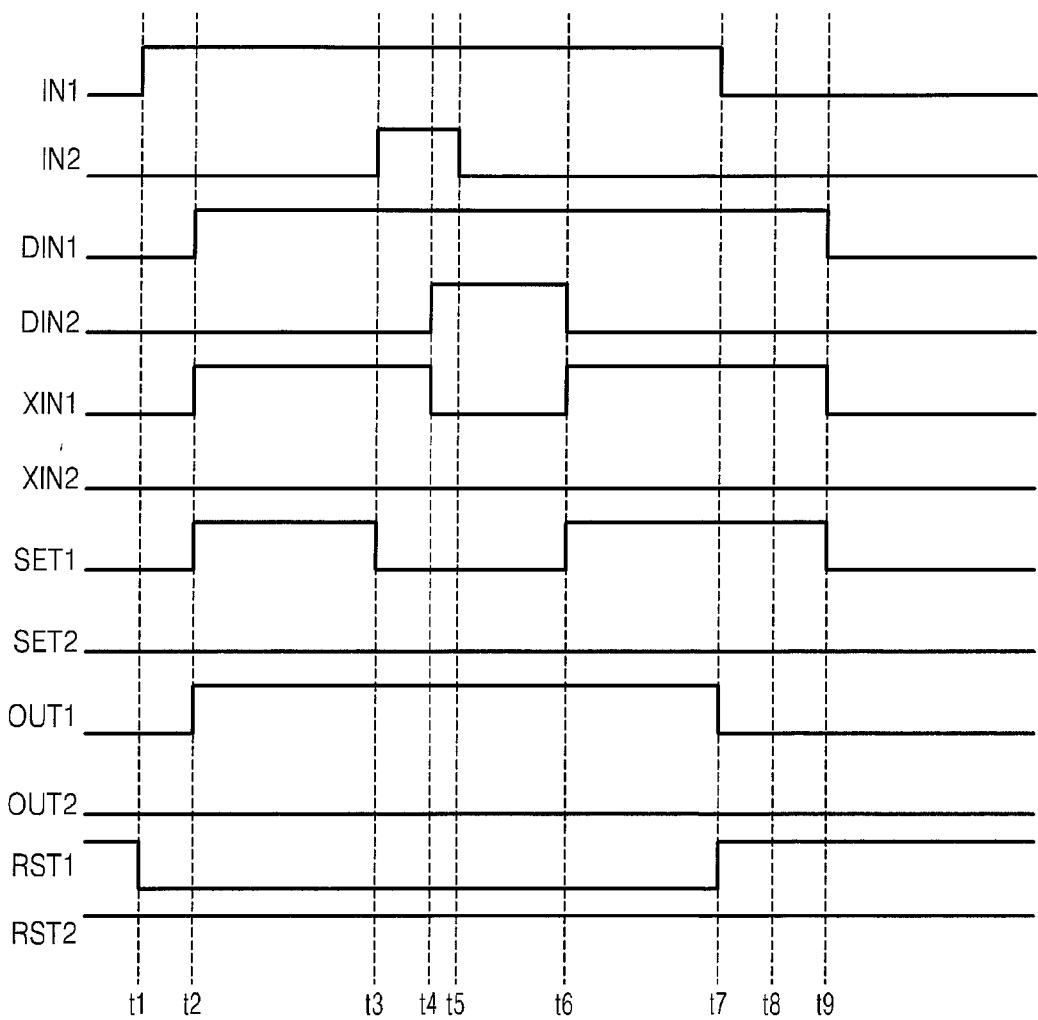

FIG. 8 is a timing diagram for explaining an operation of the interlock circuit 10 for enabling an output signal not to be enabled when an input signal is temporarily enabled.

Referring to FIG. 8, the second input signal IN2 is enabled at a time t3 and temporarily enabled during a period from the time t3 to a time t5. For example, the second input signal IN2 may be temporarily enabled due to signal interference such as electromagnetic interference (EMI).

At a time t1, the first input signal IN1 is enabled and the first reset signal RST1 is disabled. The first delayed input signal DIN1 is enabled at a time t2 after the predetermined input time from the time t1 elapses. The first exclusive input signal XIN1 is enabled at the time t2 based on the first delayed input signal DIN1 and the second delayed input signal DIN2, and the first set signal SET1 and the first output signal OUT1 are enabled. The second reset signal RST2 is enabled in response to the second input signal IN2.

At the time t3, the second input signal IN2 is enabled and the first set signal SET1 is disabled. However, although the first set signal SET1 is disabled, based on the second output signal OUT2 and the first input signal IN1 applied to the first reset circuit 213, the first reset signal RST1 is maintained in a disabled state. Accordingly, the first output latch circuit 215 may provide the first output signal OUT1 that is enabled.

The second delayed input signal DIN2 obtained by delaying the second input signal IN2, which is enabled at the time t3, by the predetermined input delay time is enabled at a time t4. The first exclusive input signal XIN1 is disabled in response to the second delayed input signal DIN2 that is enabled. However, since the second exclusive input signal XIN2 is maintained in a disabled state based on the first input signal IN1 that is maintained in an enabled state, the second set signal SET2 and the second output signal OUT2 are disabled. Also, since the first output signal OUT1 is enabled, the second reset signal RST2 is maintained in a disabled state. Accordingly, the first and second output signals OUT1 and OUT2 are not affected by the second input signal IN2 that is enabled.

Although the second input signal IN2 is disabled at the time t5, since the second delayed input signal DIN2 is disabled after the predetermined dead time, the second delayed input signal DIN2 is maintained in an enabled state.

A period from the time t5 to a time t6 may correspond to the predetermined dead time. For example, the predetermined dead time may be shown when input signals transition from logic state "high" to logic state "low", that is, may be shown on a falling edge. The second delayed input signal DIN2 is disabled, and thus the first exclusive input signal XIN1 may be enabled and the first set signal SET1 may be enabled. Since the first output signal OUT1 is in an enabled state, the first output signal OUT1 is not affected by the first set signal SET1 that is enabled.

At the time t6 after the predetermined dead time elapses, the first exclusive input signal XIN1 is enabled, and the first set signal SET1 is enabled according to the exclusive input signal XIN1 that is enabled.

At a time t7, the first input signal IN1 is disabled, and the first delayed input signal DIN1 is maintained in an enabled state since the first delayed input signal DIN1 is disabled at a time after the predetermined dead time from the time t7 at which the first input signal IN1 is disabled elapses. The first reset signal RST1 is enabled in response to the first input signal IN1 that is enabled. Since the first set signal SET1 is still in an enabled state, the first output signal OUT1 is disabled.

During a period from the time t7 at which the first delayed input signal DIN1 is disabled to a time t9 after the predetermined dead time elapses, the first exclusive input signal XIN1 is disabled in response to the first delayed input signal DIN1 that is disabled. A time t8 is a time after the present input delay time from the time t7 elapses. The first set signal SET1 is disabled in response to the first delayed input signal DIN1.

In conclusion, if the first input signal IN1 is already enabled, the first and second output signals OUT1 and OUT2 may be maintained in previous states without being affected by the second input signal IN2 that is enabled. Accordingly, the interlock circuit 10 may perform a reliable operation without being affected by a temporary change in pressure.

Figure 9:
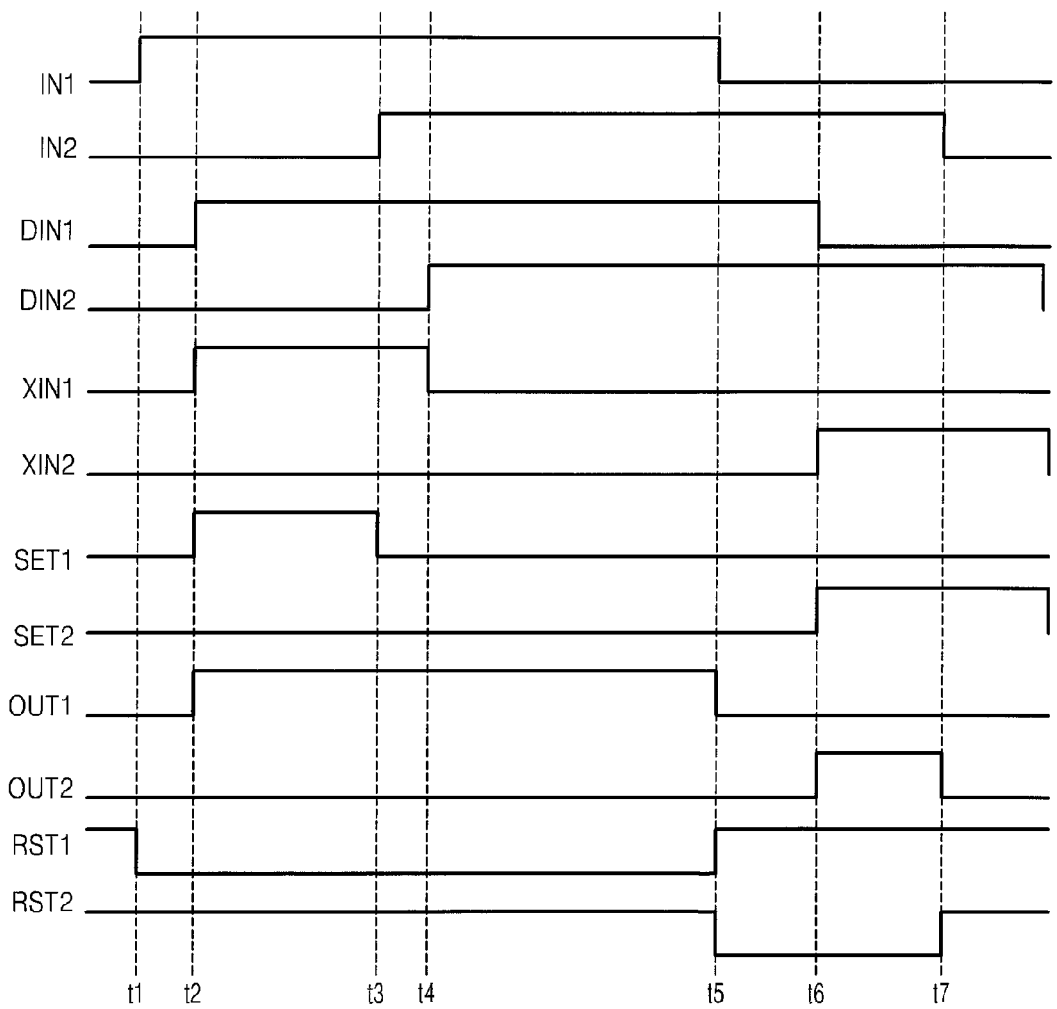

FIG. 9 is a timing diagram for explaining an operation of the interlock circuit 10 for reducing output error, which may occur when output signals simultaneously transition, by inserting the predetermined dead time.

Referring to FIG. 9, at a time t1, the first input signal IN1 is enabled, and the first reset signal RST1 is disabled in response to the first input signal IN1 that is enabled.

At a time t2 after the first input signal IN1 is enabled and the present input delay time elapses, the first delayed input signal DIN1 is enabled. At the time t2, since the second input signal IN2 is in a disabled state, the first exclusive input signal XIN1 is enabled, the first set signal SET1 is enabled, and the first output signal OUT1 is enabled.

At a time t3, the second input signal IN2 is enabled and the first set signal SET1 is disabled.

At a time t4 after the predetermined input delay time from the time t3 elapses, the second delayed input signal DIN2 is enabled and the first exclusive input signal XIN1 is disabled. However, since the first input signal IN1 is enabled, the first delayed input signal DIN1 is maintained in an enabled state, and thus the second exclusive input signal XIN2 is maintained in a disabled state. Although the first set signal SET1 is disabled, since the first output signal OUT1 is in an enabled state, the second reset signal RST2 is maintained in an enabled state and the second output signal OUT2 is disabled. Since the first input signal IN1 is maintained in an enabled state, the first reset signal RST1 is disabled. As a result, since the first set signal SET1 and the first reset signal RST1 input to the first output latch circuit 215 are disabled, the first output signal OUT1 is maintained in a previous state.

At a time t5, the first input signal IN1 is disabled, the first reset signal RST is enabled, the first output signal OUT1 is disabled, and the second reset signal RST2 is disabled.

At a time t6 after the predetermined dead time from the time t5 at which the first input signal IN1 is disabled elapses, the first delayed input signal DIN1 is disabled and the second exclusive input signal XIN2 is enabled. The second set signal SET2 is enabled in response to the second exclusive input signal XIN2, and the second output signal OUT2 is enabled. Accordingly, there is a time difference corresponding to the predetermined dead time between the time t5 at which the first output signal OUT1 is disabled and the time t6 at which the second output signal OUT2 is enabled.

In conclusion, although the interlock circuit 10 enables an output signal in response to a first enabled input signal from among first and second input signals, the interlock circuit 10 may prevent malfunction, which may occur when output signals are simultaneously enabled, by inserting a predetermined dead time in a period from a time when one output signal is disabled to a time when another output signal is enabled.

Figure 10:
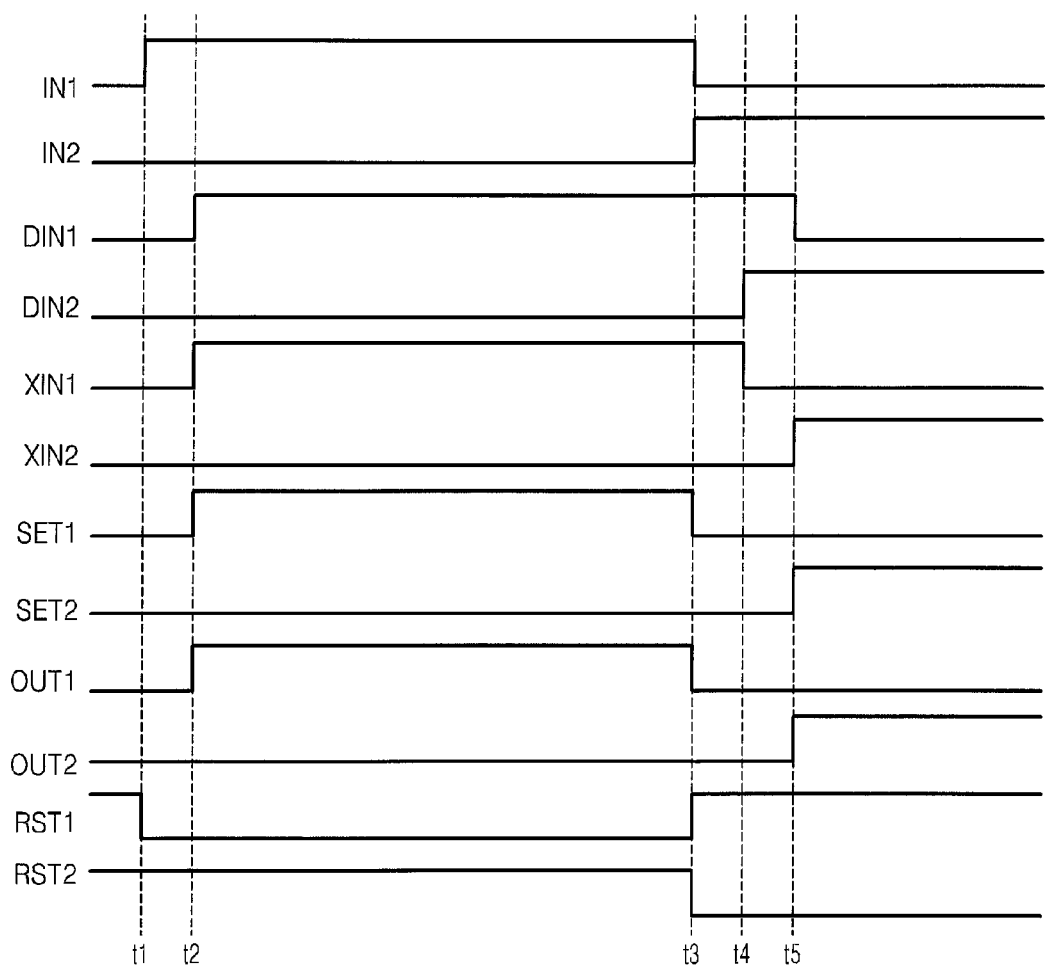

FIG. 10 is a timing diagram for explaining an operation of the interlock circuit 10 when a plurality of input signals are complementarily enabled and disabled at the same time.

Referring to FIG. 10, at a time t1, the first input signal IN1 is enabled, and the first reset signal RST1 is disabled in response to the first input signal that is enabled.

At a time t2 after the predetermined input delay time from the time t1 elapses, the first delayed input signal DIN1 is enabled and the first exclusive input signal XIN1 is enabled. The first set signal SET1 is enabled based on the first exclusive input signal XIN1 and the first delayed input signal DIN1 that are enabled. The first output signal OUT1 is enabled in response to the first set signal SET1.

At a time t3, the first input signal N1 is disabled and the second input signal IN2 is enabled. That is, at the time t3, the first input signal IN1 and the second input signal IN2 transition to have complementary values that may be reflected on output signals. However, if the first output signal OUT1 and the second output signal OUT2 change in the same manner as that of the first input signal IN1 and the second input signal IN2, an overlap section in which output signals are simultaneously enabled may be generated when the interlock circuit 10 is included in a system that operates by receiving a high voltage in response to each output signal, thereby degrading the performance of the system.

At the time t3, the first set signal SET1 is disabled in response to the second input signal IN2 that is enabled. Also, the first input signal IN1 is disabled, the first reset signal RST1 is enabled, and the first output signal OUT1 is disabled. The second reset signal RST2 is disabled based on the first output signal OUT1 that is disabled and the second input signal IN2 that is enabled.

At a time t4 after the predetermined input delay time from the time t3 elapses, the second delayed input signal DIN2 is enabled, and the first exclusive input signal XIN1 is disabled in response to the second delayed input signal DIN2 that is enabled.

At a time t5, the first delayed input signal DIN1 is disabled after the predetermined dead time in response to the first input signal IN1 that is disabled at the time t3, and the second exclusive input signal XIN2 is enabled. The second set signal SET2 is enabled in response to the second exclusive input signal XIN2 that is enabled, and the second output signal OUT2 is enabled. Accordingly, the second output signal OUT2 is enabled at the time t5 after the predetermined dead time from the time t3 at which the first output signal OUT1 is disabled elapses. Accordingly, if the first and second input signals IN1 and IN2 are enabled and disabled at substantially the same time t3 and thus the first and second output signals OUT1 and OUT2 are enabled and disabled at substantially the same time, the first and second output signals OUT1 and OUT2 are enabled at the same time, and thus circuit damage or malfunction may occur due to a high voltage abruptly flowing through circuits. The interlock circuit of FIG. 10 may minimize the malfunction of high voltage circuits by inserting a predetermined dead time between output signals.

Figure 11:
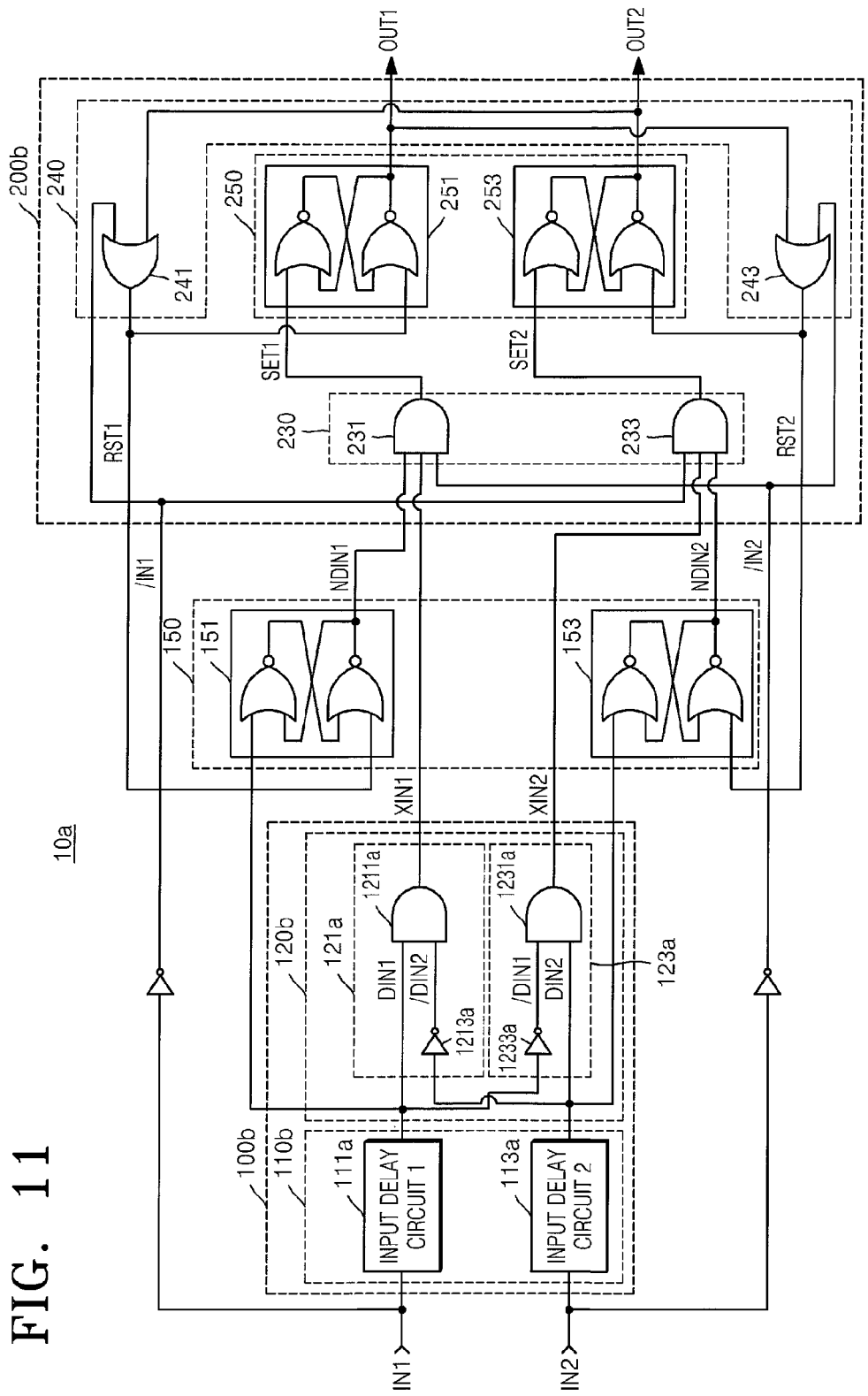
FIG. 11 is a diagram illustrating an interlock circuit according to some example embodiments

FIG. 11 is a diagram illustrating an interlock circuit 10a according to another embodiment of the present invention.

Referring to FIG. 11, the interlock circuit 10a may include a delay unit 110b, an exclusive logical operation unit 120b, a noise removing unit 150, a set unit 230, a reset unit 240, and an output latch unit 250. When compared with the interlock circuit 10 described with reference to FIGS. 1 through 6, the interlock circuit 10a of FIG. 11 may further include the noise removing unit 150.

The delay unit 110b includes a first input delay circuit 111a and a second input delay circuit 113a, and receives the first and second input signals IN1 and IN2, delays the first and second input signals IN1 and IN2 by a predetermined delay time, and provides the first and second delayed input signals DIN1 and DIN2.

The exclusive logical operation unit 120b includes first and second logical operation circuits 121a and 123a, and provides the first and second exclusive input signals XIN1 and XIN2 by performing an exclusive logical operation on the first and second delayed input signals DIN1 and DIN2. The first logical operation circuit 121a provides the first exclusive input signal XIN1 by performing a logical AND operation on the first delayed input signal DIN1 and the second complementary delayed input signal /DIN2 that is a complementary signal of the second delayed input signal DIN2. The second logical operation circuit 123a provides the second exclusive input signal XIN2 by performing a logical AND operation on the second delayed input signal DIN2 and the first complementary delayed input signal /DIN1 that is a complementary signal of the first delayed input signal DIN1.

Configurations of the delay unit 110b and the exclusive logical operation unit 120b of FIG. 11 may be substantially the same as those of FIGS. 1 through 4.

The noise removing unit 150 may include a first noise removing latch circuit 151 and a second noise removing latch circuit 153. The first and second noise removing latch circuits 151 and 153 may have substantially the same configurations as that of the RS latch circuit, and the first and second delayed input signals DIN1 and DIN2 and the first and second reset signals RST1 and RST2 may correspond to a reset signal.

The first noise removing latch circuit 151 provides a first noise suppressed signal NDIN1 that is enabled in response to the first delayed input signal DIN1, and provides the first noise suppressed signal NDIN1 that is disabled in response to the first reset signal RST1.

Likewise, the second noise removing latch circuit 153 provides a second noise suppressed signal NDIN2 that is enabled in response to the second delayed input signal DIN2, and provides the second noise suppressed signal NDIN2 that is disabled in response to the second reset signal RST2.

The set unit 230 may include a first set circuit 231 and a second set circuit 233. The first set circuit 231 may be an AND gate that provides the first set signal SET1 by performing a logical AND operation on the first noise suppressed signal NDIN1, the first exclusive input signal XIN1, and the second complementary input signal /IN2. The second set circuit 233 may be an AND gate that provides the second set signal SET2 by performing a logical AND operation on the second noise suppressed signal NDIN2, the second exclusive input signal XIN2, and the first complementary input signal /IN1.

Except that the first and second noise suppressed signals NDIN1 and NDIN2 instead of the first and second delay signals DIN1 and DIN2 are provided, configurations of the first and second set circuits 231 and 233 included in the set unit 230 are substantially the same as those of the first and second set circuits 211 and 213 illustrated in FIGS. 5 and 6.

In general, the first and second noise suppressed signals NDIN1 and NDIN2 may have similar waveforms to the first and second delayed input signals DIN1 and DIN2. However, since the first and second noise suppressed signals NDIN1 and NDIN2 may be initialized in response to the first and second reset signals RST1 and RST2, the first and second noise suppressed signals NDIN1 and NDIN2 may more robustly respond to an abrupt change in the input signals IN1 and IN2, noise-robust characteristics may be achieved.

Since configurations and operations of the reset unit 240 and the output latch unit 250 are substantially the same as those illustrated in FIG. 6, a detailed description thereof will be omitted.

Figure 12:
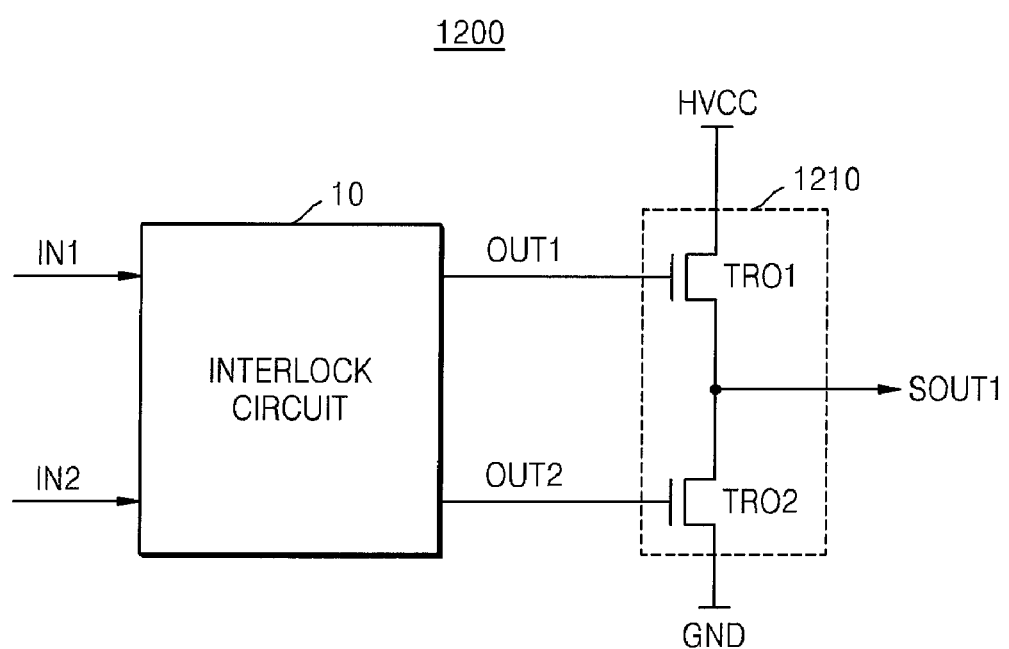
FIG. 12 is a diagram illustrating an interlock system including the interlock circuit, according to some example embodiments.

FIG. 12 is a diagram illustrating an interlock system 1200 including the interlock circuit 10, according to an embodiment of the present invention.

Referring to FIG. 12, the interlock system 1200 may include the interlock circuit 10 and an output terminal 1210.

Examples of the interlock circuit 10 may include the interlock circuits described with reference to FIGS. 1 through 11. The interlock circuit 10 receives the first and second input signals IN1 and IN2, and provides the first and second output signals OUT1 and OUT2 that are not simultaneously enabled. The first input signal IN1 may correspond to a high voltage input signal HIN that is provided to a high voltage gate driver, and the second input signal IN2 may correspond to a low voltage input signal LIN that is provided to a low voltage gate driver. However, a high voltage and a low voltage are relative terms, and an operating voltage is not limited thereto.

The output terminal 1210 may include a MOS transistor or an insulated gate bipolar transistor (IGBT). The output terminal 1210 may include first and second output transistors TRO1 and TRO2 that are connected in series between a high power supply voltage HVCC and a ground voltage GND. A configuration in which two transistors are connected in series between two power supply rails is referred to as a half-bridge configuration. The first output transistor TRO1 may correspond to a high-side gate driver, and the second output transistor TRO2 may correspond to a low-side gate driver. The first output transistor TRO1 may correspond to the high voltage gate driver, and the second output transistor TRO2 may correspond to the low voltage gate driver.

A first system output signal SOUT1 is provided through a node to which the first output transistor TRO1 and the second output transistor TRO2 are connected. When the first output signal OUT1 and the second output signal OUT2 are simultaneously enabled, the output terminal 1210 may be under a shoot-through condition or become a direct short-circuit. In the shoot-through condition, a low-resistance path may be formed in the first and second output transistors TRO1 and TRO2, and a great amount of current may flow through the first and second transistors TRO1 and TRO2. As the high power supply voltage HVCC increases, the amount of current may increase. The shoot-through condition may lead to high power consumption, power supply voltage fluctuation, and/or overheat that may damage each transistor. Accordingly, the interlock system 1200 may provide a stable voltage as the first system output signal SOUT1 by providing the first and second output signals OUT1 and OUT2 that are not simultaneously enabled. For example, a voltage of the high power supply voltage HVCC may be greater than 600 V.

Figure 13:
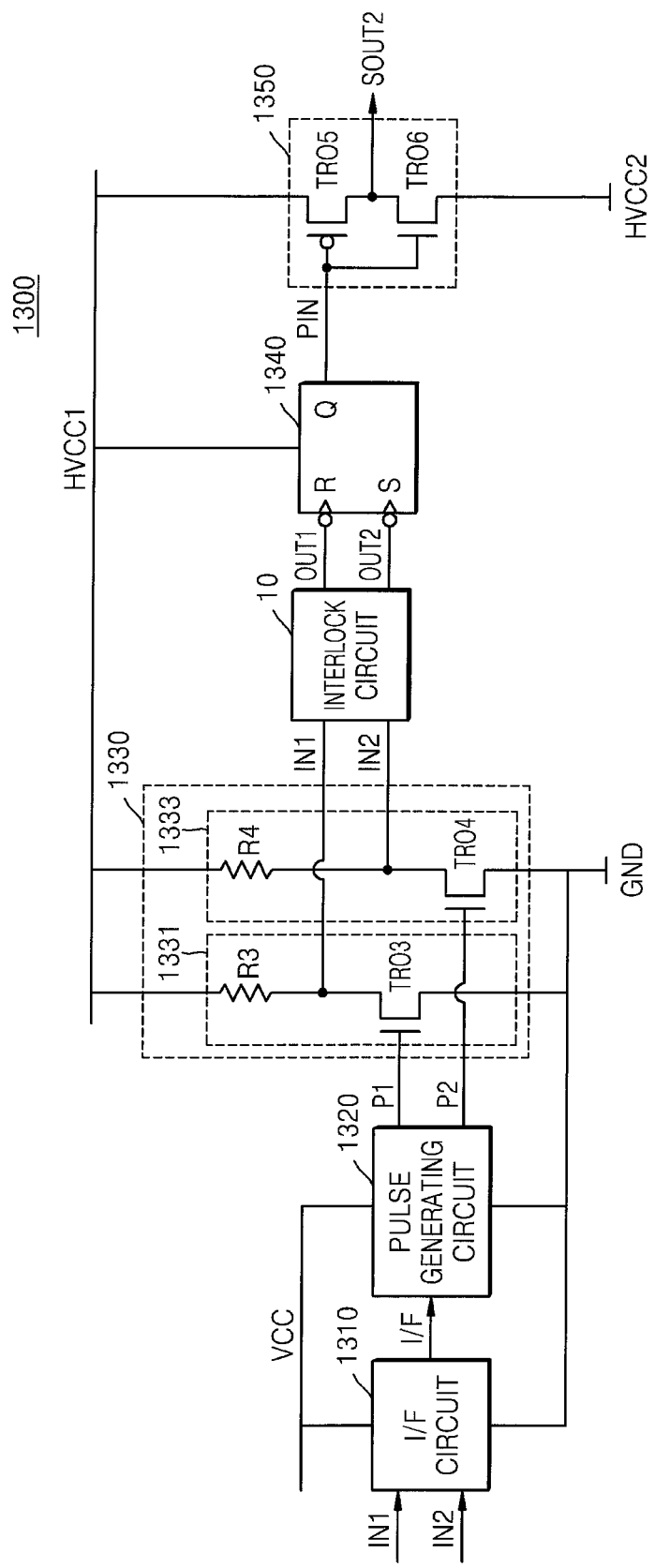
FIG. 13 is a diagram illustrating an interlock system including the interlock circuit, according to some example embodiments.

FIG. 13 is a diagram illustrating an interlock system 1300 including the interlock circuit 100, according to some example embodiments.

Referring to FIG. 13, the interlock system 1300 may include an interface circuit 1310, a pulse generating circuit 1320, an input signal generating terminal 1330, the interlock circuit 10, an RS latch 1340, and a power output unit 1350.

The interlock system 1300 of FIG. 13 may be included in a high voltage integrated circuit (HVIC) and may control an IGBT based on a second system output signal SOUT2.

Examples of the interlock circuit 10 may include the interlock circuits described with reference to FIGS. 1 through 10. The interlock circuit 10 receives the first and second input signals IN1 and IN2 and provides the first and second output signals OUT1 and OUT2 that are not simultaneously enabled.

The interface circuit 1310 is connected between a power supply voltage VCC and a ground voltage GND, and receives a high power supply input signal HIN and provides an interface signal I/F.

The pulse generating circuit 1320 is connected between the power supply voltage VCC and the ground voltage GND, and may generate a first pulse signal P1 or a second pulse signal P2 based on the interface signal I/F. The interface signal I/F may have a rising edge or a falling edge according to the high power supply input signal HIN, and may provide the first pulse signal P1 or the second pulse signal P2 in response to the rising edge or the falling edge.

The input signal generating terminal 1330 is connected between a first high power supply voltage HVCC1 and the ground voltage GND, and may include a first input signal generating unit 1331 and a second input signal generating unit 1333. The first input signal generating unit 1331 may include a third output transistor TRO3 and a third resistor R3 connected between the first high power supply voltage HVCC1 and the ground voltage GND, and the second input signal generating unit 1333 may include a fourth output transistor TRO4 and a fourth resistor R4. The third resistor R3 may be connected between a first terminal of the third output transistor TRO3 and the first high power supply voltage HVCC1. The third output transistor TRO3 may include a gate that receives the first pulse signal P1, the first terminal that is connected to the third resistor R3, and a second terminal that is connected to the ground voltage GND. The third output transistor TRO3 provides the first input signal IN1 through the first terminal in response to the first pulse signal P1.

The fourth resistor R4 may be connected between a first terminal of the fourth output transistor TRO4 and the first high power supply voltage HVCC1. The fourth output transistor TRO4 may include a gate that receives the second pulse signal P2, the first terminal that is connected to the fourth resistor R4, and a second terminal that is connected to the ground voltage GND. The fourth output transistor TRO4 provides the second input signal IN2 through the first terminal in response to the second pulse signal P2.

The first input signal IN1 may be provided in response to the first pulse signal P1, or the second input signal IN2 may be provided in response to the second pulse signal P2. The third output transistor TRO3 may be turned on in response to the first pulse signal P1, and a voltage of a terminal between the third resistor R3 and the third output transistor TRO3 may be changed when the third transistor TRO3 is turned on. Accordingly, the first input signal IN1 is provided. On the contrary, if the fourth output transistor TRO4 is turned on in response to the second pulse signal P2, the second input signal IN2 is provided.

The interlock circuit 10 provides the first output signal OUT1 and the second output signal OUT2, which are not simultaneously enabled, to the RS latch 1340 in response to the first input signal IN1 and the second input signal IN2.

The RS latch 1340 enables a power input signal PIN in response to the first output signal OUT1, and disables the power input signal PIN in response to the second output signal OUT2. If the first output signal OUT1 and the second output signal OUT2 simultaneously correspond to logic state "high" in the RS latch 1340, circuits may become very unstable. If circuits are driven by a high voltage such as a voltage of the first high power supply voltage HVCC1 and a voltage of a second high power supply voltage HVCC2, the circuits may be damaged. Accordingly, the interlock circuit 10 may improve circuit stability by preventing the first output signal OUT1 and the second output signal OUT2 from being simultaneously enabled.

The power output unit 1350 may provide a voltage of the first high power supply voltage HVCC1 to the second system output signal SOUT2 or a voltage of the second high power supply voltage HVCC2 to the second system output signal SOUT2 in response to the power input signal PIN. For example, voltages of the first high power supply voltage HVCC1 and the second high power supply voltage HVCC2 may be thousands of volts and may have a difference of about 15 V therebetween. The power output unit 1350 may include a sixth output transistor TRO6 and a fifth output transistor TRO5 connected between the first high power supply voltage HVCC1 and the second high power supply voltage HVCC2. The power input signal PIN is commonly input through gates of the fifth output transistor TRO5 and the sixth output transistor TRO6, and the fifth output transistor TRO5 and the sixth output transistor TRO6 may correspond to a PMOS transistor and an NMOS transistor that complementarily operate in response to the power input signal PIN.

However, although the interlock circuit 10 is configured to provide the first and second output signals OUT1 and OUT2 based on the first and second input signals IN1 and IN2 in FIGS. 12 and 13, the current embodiment is not limited thereto, and the interlock circuit 10 may provide a plurality of output signals that are not simultaneously enabled based on a plurality of input signals.

The interlock circuit according to the inventive concept may cancel in-phase signals in order to provide a plurality of output signals that are not simultaneously enabled, and may insert a predetermined dead time in order to prevent an overlap section in which a plurality of output signals are enabled. Also, the interlock circuit may enable an output signal based on a first enabled input signal in a first-in first-out manner. The interlock circuit and the interlock system may have a simple logic circuit configuration for performing a plurality of functions, thereby reducing the size of an integrated circuit using a high voltage.

As described above, the interlock circuit and the interlock system including the same according to the inventive concept may reduce output signal error by preventing an output signal from being enabled based on a plurality of signals that are simultaneously input within an input filter time.

Furthermore, the interlock circuit and the interlock system including the same may be implemented as small sizes since they have a simple configuration for performing a first-in first-out operation, an in-phase signal suppression operation, and an output suppression operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An interlock circuit comprising:
   an input delay unit that delays a plurality of input signals that includes a first input signal and a second input signal, provides a plurality of delayed input signals that includes a first delayed input signal and a second delayed input signal, and provides a plurality of exclusive input signals that includes a first exclusive input signal and a second exclusive input signal by performing a logical operation on the plurality of delayed input signals; and
   an output suppressing unit that provides a plurality of output signals that includes a first output signal and a second output signal, which are not simultaneously enabled, based on the plurality of exclusive input signals and the plurality of input signals, the output suppressing unit enables the first and second output signals based on the first and second exclusive input signals, the first and second input signals, and the first and second delayed input signals, disables the first output signal based on the first input signal and the second output signal, and disables the second output sinal based on the second input signal and the first output signal.

2. The interlock circuit of claim 1, wherein the input delay unit comprises:
   a delay unit comprising a plurality of input delay circuits that respectively delay the plurality of input signals and provide the plurality of delayed input signals; and
   an exclusive logical operation unit comprising a plurality of exclusive logical operation circuits that provide the plurality of exclusive input signals by respectively performing exclusive logical operations on the plurality of delayed input signals.

3. The interlock circuit of claim 2, wherein a first exclusive logical operation circuit included in the plurality of exclusive logical operation circuits provides the first exclusive input signal included in the plurality of exclusive input signals by performing an logical AND operation on the first delayed input signal, and complementary signals of delayed input signals other than the first delayed input signal.

4. The interlock circuit of claim 2, wherein a first input delay circuit included in the plurality of input delay circuits comprises:
   a first transistor comprising a gate that receives the first input signal included in the plurality of input signals and a first terminal that receives a power supply voltage;
   a first resistor that is connected between a first node and a second terminal of the first transistor;
   a second transistor comprising a gate that receives the first input signal, a first terminal that is connected to a ground voltage, and a second terminal that is connected to the first node;
   a second resistor that is connected between the first node and a second node; and
   a capacitor that is connected between the ground voltage and the second node.

5. The interlock circuit of claim 4, wherein the first delayed input signal included in the plurality of delayed input signals is provided by the second node,
   wherein when the first input signal transitions from logic state "low" to logic state "high" the first delayed input signal is delayed by a predetermined input delay time, and
   when the first input signal transitions from logic state "high" to logic state "low", the first delayed input signal is delayed by a predetermined dead time.

6. The interlock circuit of claim 5, wherein the predetermined input delay time and the predetermined dead time are determined based on the first and second resistors.

7. The interlock circuit of claim 6, wherein the predetermined dead time is longer than the predetermined input delay time.

8. The interlock circuit of claim 1, wherein the output suppressing unit comprises a plurality of output suppressing circuits,
   wherein each of the plurality of output suppressing circuit in the plurality of output suppressing circuits comprises:
   a set circuit that provides a first set signal by performing a logical AND operation based on a the first exclusive input signal included in the plurality of exclusive input signals, a the first delayed input signal included in the plurality of delayed input signals, and a second complementary input signal corresponding to a complementary signal of a the second input signal included in the plurality of input signals;
   a reset circuit that provides a first reset signal by performing an OR logical operation on a the second output signal and a first complementary input signal corresponding to a complementary signal of the first input signal; and
   an output latch circuit that provides a the first output signal based on the first set signal and the first reset signal.

9. The interlock circuit of claim 8, wherein the output latch circuit enables the first output signal in response to the first set signal, and disables the first output signal in response to the first reset signal.

10. An interlock system comprising:
    an interlock circuit that receives first and second input signals and provides first and second output signals that are not enabled simultaneously; and
    an output terminal that provides a system output signal in response to the first and second output signals,
    wherein the interlock circuit comprises:
    an input delay unit that delays the first and second input signals by a predetermined delay time, provides first and second delayed input signals, and provides first and second exclusive input signals by performing a logical operation on the first and second delayed input signals; and
    an output suppressing unit that enables the first and second output signals based on the first and second exclusive input signals, the first and second input signals, and the first and second delayed input signals, disables the first output signal based on the first input signal and the second output signal, and disables the second output signal based on the second input signal and the first output signal.

11. The interlock system of claim 10, wherein the output terminal comprises:
   a first output transistor comprising a gate that receives the first output signal, and a first terminal that receives a high power supply voltage; and
   a second output transistor comprising a gate that receives the second output signal, a first terminal that is connected to a second terminal of the first output transistor, and a second terminal that is connected to a ground voltage,
   wherein the system output signal is provided through the second terminal of the first output transistor.

12. The interlock system of claim 10, wherein the output terminal comprises:
   a reset/set (RS) latch that enables a power input signal in response to the first output signal, and disables the power input signal in response to the second output signal; and
   a power output unit that provides the system output signal in response to the power input signal.

13. The interlock system of claim 12, wherein the power output unit comprises:
   a first output transistor comprising a gate that receives the power input signal, and a first terminal that is connected to a first high power supply voltage; and
   a second output transistor comprising a gate that receives the power output signal, a first terminal that is connected to a second terminal of the first output transistor, and a second terminal that is connected to a second high power supply voltage,
   wherein the system output signal is provided from the second terminal of the first output transistor.

14. The interlock system of claim 12, further comprising:
   a first input signal generating unit that comprises a third resistor connected in series between the first high power supply voltage and a ground voltage, and a third transistor, and provides the first input signal to a terminal between the third resistor and the third output transistor in response to a first pulse signal; and
   a fourth input signal generating unit that comprises a fourth resistor connected in series between the first high power supply voltage and the ground voltage, and a fourth output transistor, and provides the second input signal to a terminal between the fourth resistor and the fourth output transistor in response to a second pulse signal.

* * * * *

UNITED STATES PATENT AND TRADEMARK OFFICE
CERTIFICATE OF CORRECTION

PATENT NO. : 8,330,490 B2
APPLICATION NO. : 12/941803
DATED : December 11, 2012
INVENTOR(S) : Jung-Ho Lee et al.

It is certified that error appears in the above-identified patent and that said Letters Patent is hereby corrected as shown below:

on column 19, line 21, after "output", replace "sinal" with

-- signal --

Signed and Sealed this
Nineteenth Day of February, 2013

Teresa Stanek Rea
*Acting Director of the United States Patent and Trademark Office*